United States Patent [19]
Grzyb et al.

[11] Patent Number: 5,656,834
[45] Date of Patent: Aug. 12, 1997

[54] IC STANDARD CELL DESIGNED WITH EMBEDDED CAPACITORS

[75] Inventors: Claus D. Grzyb, Sunnyvale; Ori K. Mizrahi-Shalom, San Jose, both of Calif.

[73] Assignee: Philips Electronics North America Corporation, Tarrytown, N.Y.

[21] Appl. No.: 662,742

[22] Filed: Jun. 10, 1996

Related U.S. Application Data

[63] Continuation of Ser. No. 308,773, Sep. 19, 1994, abandoned.
[51] Int. Cl.[6] .......................... H01L 29/78; H01L 27/02; H01L 27/10
[52] U.S. Cl. .......................... 257/207; 257/333; 257/334; 257/532; 257/203; 257/300; 257/208
[58] Field of Search .......................... 257/207, 204, 257/206, 208, 296, 300, 304, 321, 333, 334, 203, 532

[56] References Cited

U.S. PATENT DOCUMENTS

| | | | |
|---|---|---|---|
| 4,258,378 | 3/1981 | Wall | 257/316 |
| 4,361,847 | 11/1982 | Harari | 257/321 |
| 4,467,450 | 8/1984 | Kuo | 257/302 |
| 4,612,629 | 9/1986 | Harari | 257/262 |
| 4,805,071 | 2/1989 | Hutter et al. | 257/370 |
| 4,811,078 | 3/1989 | Tigelaar et al. | 257/306 |
| 4,929,989 | 5/1990 | Hayano | 257/296 |
| 5,264,723 | 11/1993 | Strauss | 257/532 |
| 5,317,180 | 5/1994 | Hutter et al. | 257/370 |
| 5,444,288 | 8/1995 | Jacobs | 257/503 |

OTHER PUBLICATIONS

"Speed and Complexity Fuel CMOS ASIC Growth", ASIC & EDA, Jan. 1993, beginning at p. 24.

*Primary Examiner*—Sara W. Crane
*Assistant Examiner*—Alexander Oscar Williams
*Attorney, Agent, or Firm*—Leroy Eason

[57] ABSTRACT

Integrated circuits running with high frequencies are a potential source for RFI (Radio Frequency Interference). To reduce RFI, on-chip decoupling capacitors are included in the design. To gain maximum advantage of these decoupling capacitors, they should be placed close to drivers and flip-flops. In a standard cell design approach for fabrication of the ICs, capacitors are embedded below the power supply lines. These capacitors are put in special cells, called capcells, which are placed by the place and route software on either side of each row of standard cells. Thin oxide capacitors are preferred because they offer the largest capacitance per area. In addition, first and second metal above the capacitor are increased to form thick oxide capacitors that give additional capacitance.

19 Claims, 3 Drawing Sheets

IC STANDARD CELL DESIGNED WITH EMBEDDED CAPACITORS

This is a continuation of application Ser. No. 08/308,773, filed Sep. 19, 1994, now abandoned.

FIELD OF THE INVENTION

This invention relates to integrated circuits (ICs), and in particular to standard cell ICs provided with means for decoupling power supply lines.

BACKGROUND OF INVENTION

Standard cell design technology is widely used in the semiconductor art to make custom ICs, because it reduces the design time of integrated circuits. Standard cells are usually stored in libraries and provide the designer with many more or less complex functions that are necessary for the circuit design. All standard cells have at least two different views, a symbol view and layout view. The symbol is used to draw the actual circuit schematic. The layout view is used to create the real layout. The big advantage of standard cells is the possibility of using standard cell place and route tools. These computerized tools extract the electrical connections between the cells from the schematic and then the placement software places the standard cells automatically. The cells are placed in several rows. After the placement, the router is used to connect all cells according to the schematic. Placement and routing can be modified by specifying certain constraints, e.g. number of rows, a certain ratio between width and height of the layout, etc. Due to the marketing requirements to develop integrated circuits in very short time frames, standard cell design is becoming more and more important. See, for example, the description given in "Speed and Complexity Fuel CMOS ASIC Growth", ASIC & EDA, Jan. 1993, beginning at pg. 24.

Semiconductor vendors that provide to its customers standard cell capability make available a library of designs for active components, such as bipolar and MOS transistors, and passive components, such as resistors and capacitors. The designs generally conform to particular component geometries built in accordance with particular fabrication processes that the vendor can use to make an IC circuit employing components of the library. The whole system is computer controlled. A customer who desires that the IC vendor supply him with particular custom ICs uses software provided by the vendor, based upon the circuit chosen or functions desired, to choose from the library the components desired and then under computer control to provide a layout of the components and their interconnections such that when implemented as an IC will perform the functions desired by the customer. The components are typically laid out in parallel rows in blocks, typically arranged in rows of cells typically of the same height but different widths to accommodate the size of the component needed, and interconnected using the place and route software via routing channels located between the rows. The above is well known in the art and further details are not necessary to understand the invention. The problem solved by the invention is as follows.

Integrated circuits running with high frequencies are a potential source for RFI (Radio Frequency Interference). One measure to reduce RFI is to include on-chip decoupling capacitors in the design. To gain maximum advantage of these decoupling capacitors, they have to be placed close to drivers and flip-flops. Because most of the blocks of a chip are built by using place and route software, manual placement of capacitors is unwanted.

SUMMARY OF INVENTION

An object of the invention is a standard cell design for ICs which includes means for reducing RFI.

Another object of the invention is a standard cell design for ICs providing for automatic placement of decoupling capacitors to reduce RFI.

In accordance with a first aspect of the invention, automatically included in the cell design are capacitors located below the power supply lines. The capacitors are automatically included on either side of each row of standard cells in cells specifically provided for that purpose. In this way, manual placement is avoided and automatic decoupling is provided each time a new row of standard cells is added to the circuit.

In accordance with another aspect of the invention, the standard cell design uses a 2-metal level fabrication process, with the first metal layer directly connected to the decoupling capacitor and also to the standard cells in one row, and with the second metal connecting the whole block of cells to the power supply rails. This has the advantage that during power peaks, the majority of the current is supplied by the decoupling capacitors.

The various features of novelty which characterize the invention are pointed out with particularity in the claims annexed to and forming a part of this disclosure. For a better understanding of the invention, its operating advantages and specific objects attained by its use, reference should be had to the accompanying drawings and descriptive matter in which there are illustrated and described the preferred embodiments of the invention, and in which like reference numerals denote the same or similar components.

DETAILED DESCRIPTION OF PREFERRED EMBODIMENTS

Figure 1:
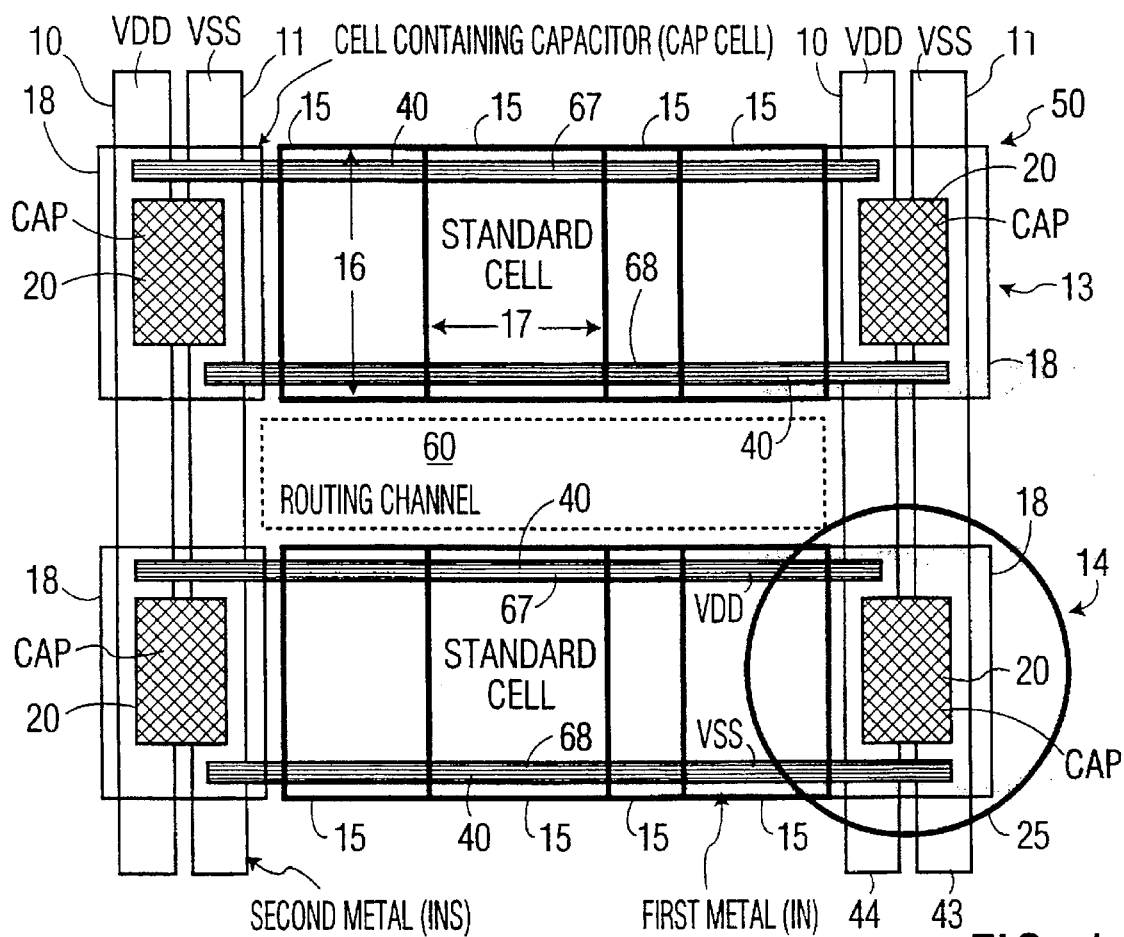
FIG. 1 is a top or plan view of two rows of a standard cell design in accordance with the invention.

FIG. 1 shows the layout of a standard cell design for an IC containing decoupling capacitors according to the invention. Only two rows of standard cells are shown, but it will be understood that an actual IC implemented as a standard cell design would have many such rows. The conventional standard cell design provides for many parallel rails running vertically along the chips, each comprising a first rail 10 VDD and a second rail 11 VSS, only two of which are shown in FIG. 1. For atypical n-MOS circuit, VDD would be at a positive voltage and VSS at ground. Between each set of paired rails 10, 11 would be located many rows which would accommodate in cells components from the library. Each row could typically contain from 50–60 standard cells. In FIG. 1, two such rows 13, 14 are shown. Each of the rectangular boxes designated 15 constitutes a cell to house a component of the circuit. In this example, the cells 15 have standard heights 16 and different widths 17.

An additional box 18, having the same height, is provided under each pair 10, 11 of the rails at each row end 13, 14. In accordance with the invention, a decoupling capacitor 20 is provided in each of the additional boxes 18 which represent special cells called cap-cells. These capacitors 20 are automatically placed by the place and route software on either side of each row of standard cells, embedded below the power supply lines 10, 11. This placement ensures that the decoupling capacitors are in close proximity to drivers and flip-flops built from the standard cells thus providing maximum reduction of RFI. The system of the invention which automatically places a decoupling capacitor 20 on either side of a row of standard cells also guarantees that the number of decoupling capacitors increases when the number of rows increases.

Most ICs nowadays are constructed of C-MOS or n-MOS circuits and fabricated by well known processes in silicon substrates based on LOCOS technology isolation, implanted self-aligned source and drain electrodes using the gate electrode as a mask, polysilicon gates, multi-metal interconnect levels, and the use of n-wells to house p-MOS transistors and p-wells to house n-MOS transistors if used. Oxide layers are grown or deposited. The grown oxide under the gate electrode is referred to as a thin oxide, which for a one-micron process would be about 13–17 nm thick. The oxides used to insulate the conductive layers (metal, polysilicon) are deposited and are called thick oxides because their thickness is typically much larger, about 0.5–0.8 microns thick, and is not as critical as the gate oxide. LOCOS, as is well known, uses a grown inset thick oxide to isolate components.

It is preferred to construct the decoupling capacitors 20 as thin oxide capacitors to provide the largest capacitance per area, the thin oxide being grown at the same time as the gate oxide. In addition, because a thin oxide is used, first and second metal interconnects located above the decoupling capacitors 18 can be increased to form with the usual intervening oxide insulating layer an additional thick oxide capacitor that provides additional decoupling capacitance. In FIG. 1, the first metal level, labelled IN, is used to interconnect opposed rails of the same voltage formed by the second metal level designated INS.

Figure 2:
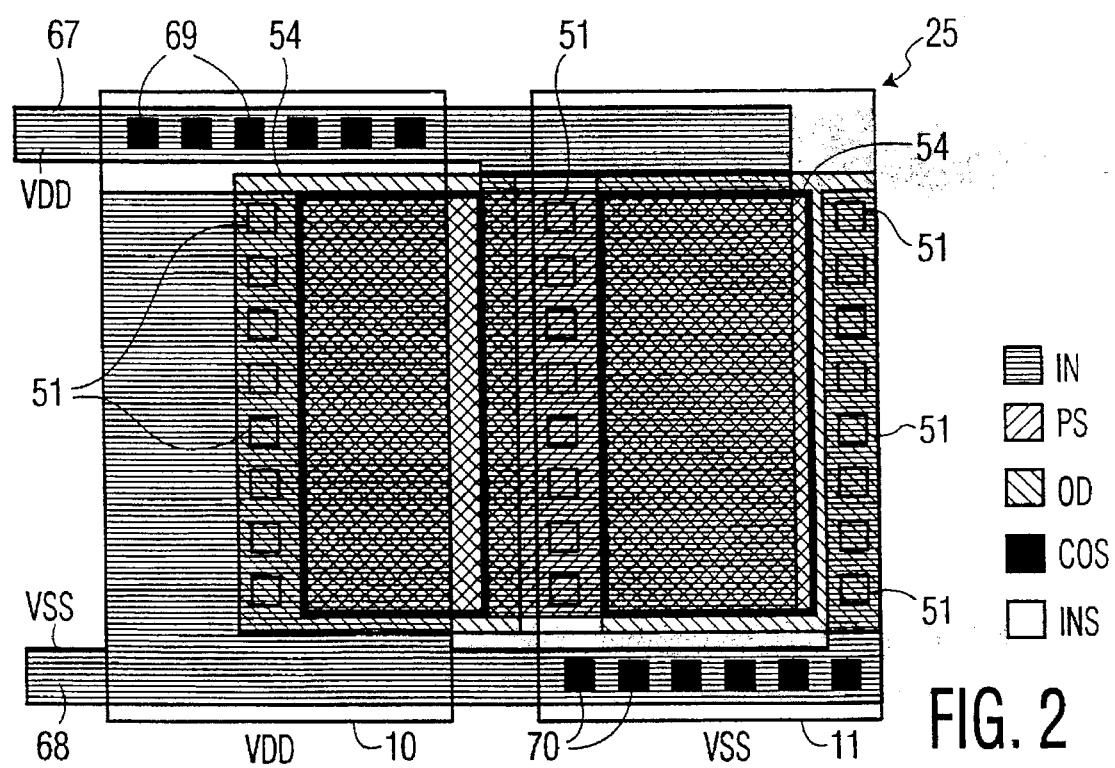
FIG. 2 is a layout view of one form of a decoupling capacitor in the standard cell design of FIG. 1 showing how decoupling capacitors in accordance with the invention are fabricated.

FIG. 2 is a detailed layout view of the encircled area designated 25 in FIG. 1. FIG. 2 also has in the upper left corner legends designating by hatching, shading, etc. the various layers of materials used, with the following meaning:

IN means first metal;
PS means polysilicon;
CO means a connection between polysilicon and first metal or diffusion and first metal;
OD means oxide definition (windows);
NW means an n-well in the substrate;
COS means a connection between first and second metal;
INS means second metal.

Figure 4:
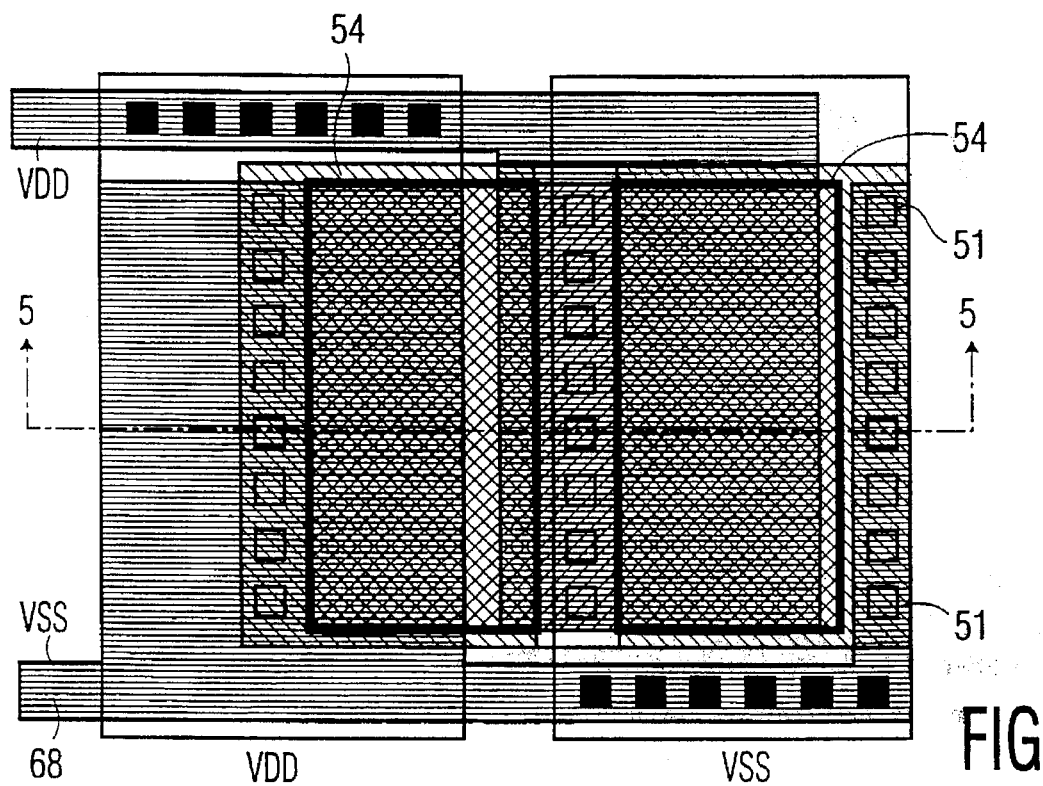
FIG. 4 is a view similar to FIG. 2 showing more clearly the decoupling capacitor.
Figure 5:
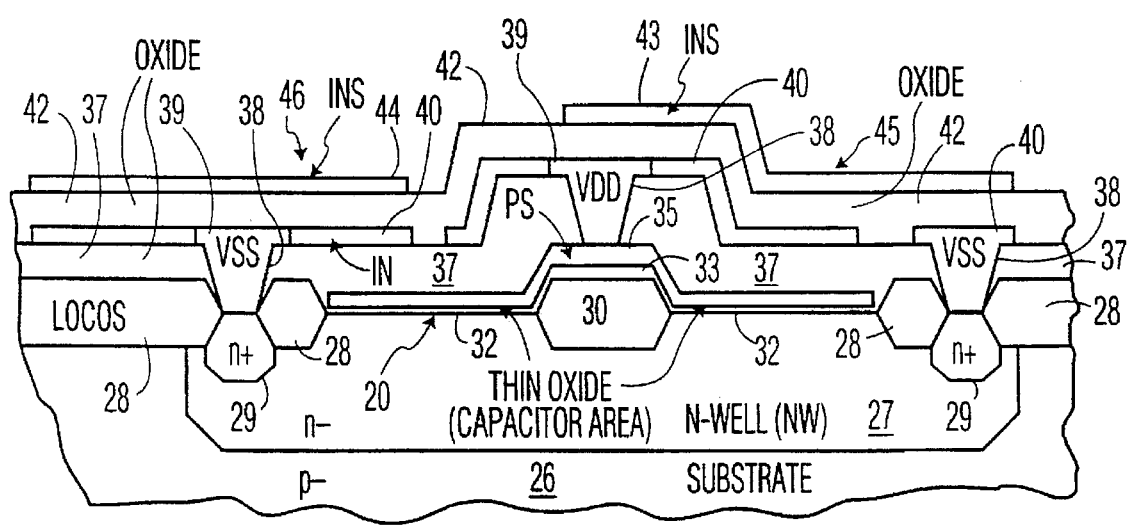
FIG. 5 is a cross-sectional view of part of the device illustrated in FIGS. 2 and 4 at the location of the decoupling capacitors taken along the line 5—5 in FIG. 4.

These codes will be clearer from the cap-cell cross-section in FIG. 5, which is taken along the line 5—5 of FIG. 4, which corresponds to FIG. 2.

FIG. 5 shows a thin-oxide capacitor 20 fabricated in accordance with the invention using a standard state-of-the art C-MOS process. As stated earlier, the IC is typically fabricated in a p-type silicon substrate 26 which is provided by diffusion or implantation with n-wells 27 in which p-MOS transistors would be fabricated. An n-well 27 formed at the same time is used to house the decoupling capacitor 20 of the invention. In the usual way, LOCOS regions 28 are used to isolate the n-well 27 and also n+ contact regions 29 for the n-well 27. A LOCOS region 30 is also provided at the center of the n-well. In the usual way, a thin oxide 32 is gown over the silicon n-well at the same time that the gate oxides for the MOS transistors are grown. The oxide 33 that forms over the LOCOS oxide 30 at the center has about the same thickness as that of the thin oxide 32. When the polysilicon gates are formed, a polysilicon electrode 35 is also formed over the thin oxide 32 and oxide 33. During implantation of the source and drain regions, the polysilicon electrode 35 is heavily doped with impurities and becomes sufficiently conductive to serve as the upper electrode of the decoupling capacitor 20. The lower electrode is formed by the n-well 27 and its n+ contacts 29. The usual IC processing then follows. A first thick oxide insulator 37 is deposited, followed by forming vias 38 through which contacts 39 are made between the deposited first metal layer 40 and the n+ contact regions 29 and between the first metal layer 40 and the polysilicon electrode 35. A second thick oxide 42 is then deposited followed by the second metal layer 43, 44 which is also used for making other component interconnections (not shown). It will be noted that the second metal part 43 shown at the right corresponds to the VSS rail 11 in FIG. 1, and the second metal part 44 on the left corresponds to the VDD rail in FIG. 1. Note that both second metal parts 43, 44 are insulated by the second deposited oxide 42 from the capacitor 20, but that a layer 40 of first metal extends under each of the second metal parts 43, 44 forming with the intervening thick oxide 42 a thick oxide capacitor, 45, 46, and each of the first metal electrodes 40 of each of the thick oxide capacitors 45, 46 are directly connected via metal 39 to a respective electrode 35, 27–29 of the thin oxide capacitor 20. Note also that the first 40 and second 43, 44 metal parts are extended laterally so as to increase their area and thus the capacitance of the thus-formed thick oxide capacitors 45, 46. The electrical result is to place two thick oxide capacitors 45, 46 and one thin oxide capacitor 20 in series between the VSS 43 and VDD 44 rafts. Connecting the thin oxide capacitor 20 to first metal 40 via several contacts 39 insures a small R and thus small inherent RC time constant of the structure.

The first metal (IN) 40 also connects the standard cells 15 of each row (FIG. 1) via horizontal lines 67, 68 to respective VDD, VSS rails. The whole block 50 of multiple rows 13, 14 uses the second metal (INS) 43, 44 (rails 11, 10 in FIG. 1) to connect to the power supply. Thus, the cap-cell 16 also contains connections between first and second metal, which is done by plural via-contacts 51 to insure a small inherent KC of the structure. These are not shown in FIG. 5 to avoid cluttering up the drawing, but are shown as the columns of small squares in FIGS. 2–4. These contacts 51 have a small amount of resistance due to their small size, which helps decouple the thin oxide capacitor 20 from the power supply. As a result, during power peaks, which occur in synchronous designs at the active clock edge, the majority of the current is supplied from the capacitors, which also reduces RFI. When the power peak ends, the capacitors are recharged by the power supply.

It will be further noted that a thick oxide grown LOCOS region 30 is formed in the center of the n-well 27 (FIG. 5). The purpose of this is to allow provision of a contact 39 between metal 40 and the polysilicon electrode 35. Such contacts are only allowed over a LOCOS region. This effectively results in two side-by-side capacitor sections defined by the openings inside the LOCOS regions 28, 30. The boundaries of these sections is shown in heavy black as two bold rectangles 54 in FIG. 4, also in FIG. 2. The rectangles 54 is the common area of the polysilicon (PS) and oxide definition (OD). The respective via-contacts of the VDD and VSS horizontal lines to their respective rails 10, 11 are shown at 69, 70.

It will be appreciated that the particular kind of circuit implemented by the standard cell design is unimportant. To implement the invention merely requires that the library include as a standard item a thin oxide capacitor which is preferably used to implement the decoupling capacitor 20, and that the place and route software automatically allows for the placement of a cap-cell 18 under each pair of supply rails on opposite sides of each row of cells whenever a new row is added to the design.

Also the invention is not limited to the particular component layouts or compositional levels used in the preferred embodiments, and obviously can be implemented in other standard cell designs. For example, some standard cells provide a third metal level which can serve as the supply rails. In the latter case, the decoupling capacitors can be placed between the second and third metal levels. FIG. 1 also shows that the standard cell rows 13, 14 are typically spaced apart, with the space 60 between used as a routing channel for cell or component interconnections.

While the invention is not so limited, the cap-cells described have been implemented in a 0.8 micron, twin-well, CMOS process using LOCOS, self-aligned polysilicon gates, and double layer metal interconnects. With this process, the capacitance of the decoupling capacitor was approximately 0.6 pf; and its resistance approximately 125 ohms. This results in an RC time constant of 75 ps.

Figure 3:
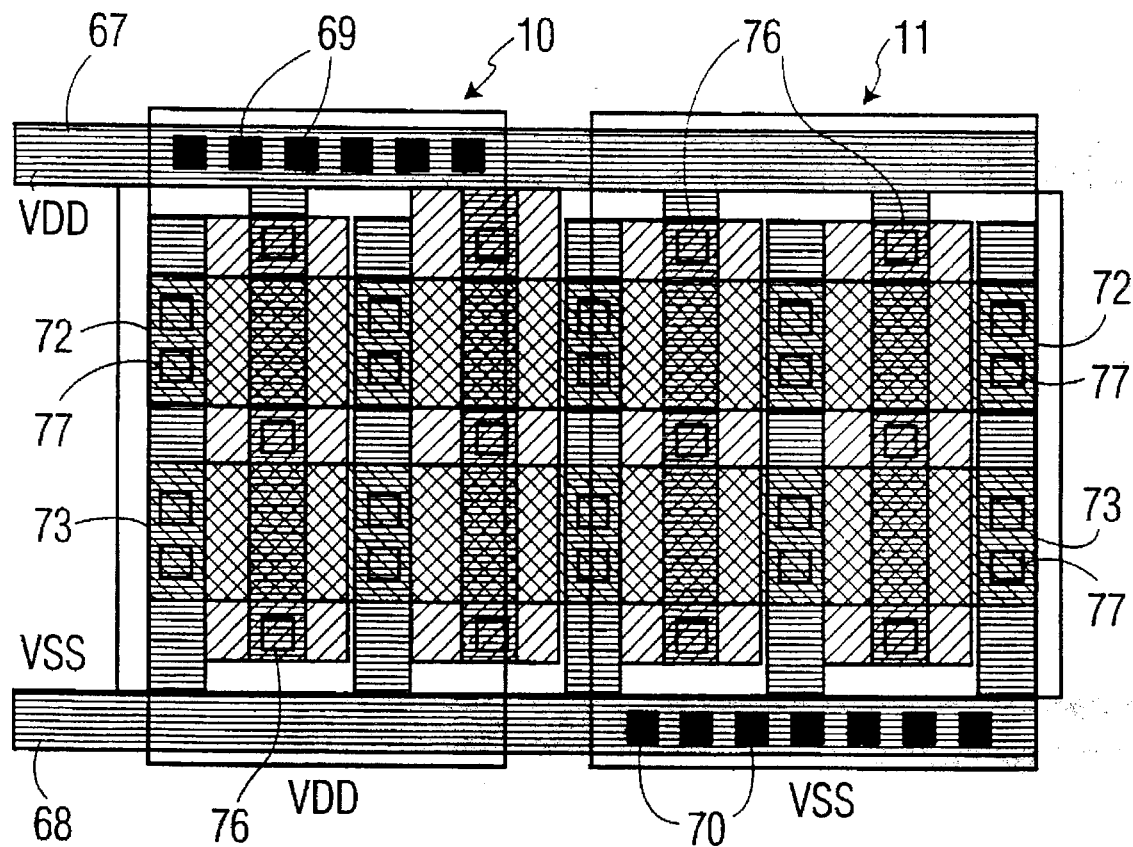
FIG. 3 is a layout view similar to that of FIG. 2 showing another form of decoupling capacitor according to the invention.

FIG. 3 shows a modified cap-cell exhibited a still smaller RC time constant of approximately 16 ps. This is accomplished by rearranging the two capacitor sections to extend horizontally instead of vertically as in FIG. 4. The two sections, double cross-hatched, are designated 72, 73 in FIG. 3, form two longer, narrower rectangles than the rectangles 54 in FIG. 4, and also extend completely under both rails 10, 11. As indicated in FIG. 5, the two capacitor sections 72, 73 are defined by LOCOS regions such as 28 in FIG. 5 at the outer boundaries, and by a LOCOS region such as 30 in FIG. 5 between the two sections 72, 73. The via-contacts of the VDD line 67 to the polysilicon electrode 35 are shown at 76. The via-contacts of the VSS line 68 to the n+ contact regions 29 are shown at 77. The increased via-contacts to the capacitor electrodes, and their interleaving arrangement which reduces the spacing between n+ contact regions 29, means that shorter n-regions of the n-well 27 are located between the contact regions which means reduced resistance R.

While the invention has been described in connection with preferred embodiments, it will be understood that modifications thereof within the principles outlined above will be evident to those skilled in the art and thus the invention is not limited to the preferred embodiments but is intended to encompass such modifications.

What is claimed is:

1. An IC standard cell design comprising:
   (a) an IC chip;
   (b) spaced pairs of voltage supply lines for providing supply voltages for electronic components, the supply lines extending over the chip in columnar directions;
   (c) spaced rows of standard cells embedded in the chip, each cell having electronic components therein, each row extending between adjacent pairs of voltage supply lines, the standard cell at each end of each row being an end-cell, each end-cell being located under and connected to the adjoining pair of voltage supply lines; and
   (d) a plurality of decoupling capacitors respectively included in the respective end-cells of respective ones of said rows, each decoupling capacitor being connected between the pair of voltage supply lines to which the associated end-cell is connected;

whereby a program for establishing continuous place-and-route interconnections between the standard cells in each row is compatible with automatically providing for decoupling of said cells from transient impulses on the voltage supply lines.

2. The standard cell design of claim 1, wherein each of said decoupling capacitors comprises a thin oxide capacitor.

3. The standard cell design of claim 1, wherein the voltage supply lines are implemented by a second layer of metal and the standard cells are connected to the voltage supply lines by a first layer of metal extending below the second layer.

4. The standard cell design of claim 3, wherein the decoupling capacitors each comprise a thin oxide capacitor.

5. The standard cell design of claim 2, wherein the plural decoupling capacitors each further comprise a thick oxide capacitor.

6. The standard cell design of claim 1, wherein the standard cells are built on a semiconductor substrate employing polysilicon MOS transistor gates, a substrate well, and a thin oxide as the gate oxide of the MOS transistor, said at least one of said plural decoupling capacitors comprising a lower electrode constituted by the substrate well, a thin oxide over the substrate well as the capacitor dielectric, and an upper electrode constituted by a polysilicon layer over the thin oxide.

7. The standard cell design of claim 6, further comprising a thick first insulator over the polysilicon layer, a first metal layer over the first insulator, a thick second insulator over the first metal layer, a second metal layer over the second insulator, first connections between first portions of the first metal layer and the substrate well, second connections between second portions of the first metal layer and the polysilicon layer, third connections between one of the voltage supply lines and the first portions of the first metal layer, fourth connections between the other of the voltage supply lines and the second portions of the first metal layer.

8. The standard cell design of claim 7, wherein the voltage supply lines are constituted of portions of the second metal layer.

9. The standard cell design of claim 8, wherein the first and second metal layers form with the intervening second insulator thick oxide capacitors connected to the upper and lower electrodes, respectively.

10. The standard cell design of claim 6, wherein each decoupling capacitor comprises two sections in parallel.

11. The standard cell design of claim 10, wherein the two sections form elongated rectangles extending parallel to the columnar directions of the voltage supply lines.

12. The standard cell design of claim 10, wherein the two sections form elongated rectangles extending transverse to the columnar directions of the voltage supply lines.

13. An IC standard cell design comprising an IC chip, a spaced pair of voltage supply lines for providing supply voltage for electronic components and extending over the chip in columnar directions, spaced rows of standard cells embedded in the chip and extending between and connected to adjacent pairs of voltage supply lines, wherein the standard cells are built on a semiconductor substrate employing polysilicon MOS transistor gates, a substrate well, and a thin oxide as the gate oxide of the MOS transistor, and plural decoupling capacitors comprising a first thin film capacitor including, a first electrode constituted by the substrate well, a thin oxide over the substrate well as the capacitor dielectric, and a second electrode constituted by a polysilicon layer over the thin oxide, and a second thick film capacitor comprising a thick first insulator over the polysilicon layer, a first metal layer over the thick first insulator, a thick second insulator over the first metal layer, a second metal layer over the thick second insulator, first connections between first portions of the first metal layer and the substrate well, second connections between second portions of the first metal layer and the polysilicon layer, third connections between one of the voltage supply lines and the first portions of the first metal layer, fourth connections between the other of the voltage supply lines and the second portions of the first metal layer.

14. The standard cell design of claim 13, wherein the voltage supply lines are constituted of portions of the second metal layer.

15. The standard cell design of claim 13, wherein the first and second metal layers form with the intervening second insulator thick oxide capacitors connected to the first and second electrodes, respectively.

16. The standard cell design of claim 13, wherein each decoupling capacitor comprises two sections in parallel.

17. The standard cell design of claim 16, wherein the two sections form elongated rectangles extending parallel to the columnar directions of the voltage supply lines.

18. The standard cell design of claim 16, wherein the two sections form elongated rectangles extending transverse to the columnar directions of the voltage supply lines.

19. An IC capacitor comprising:
(a) a substantially rectangular IC chip having a silicon substrate, a diffusion layer formed in a well in a surface of said substrate, a thin oxide layer formed over said diffusion layer, and a polysilicon layer formed over said oxide layer;
(b) a spaced pair of voltage supply lines extending in parallel and respectively adjoining opposite edges of said chip;
(c) each of said supply lines having a series of spaced finger portions extending transversely thereto over said chip, the finger portions of each supply line being inter-digitated between but separate from the finger portions of the other of said supply lines;
(d) a series of via contacts along each of said finger portions, the via contacts of a first of said supply lines being in electrical contact with said diffusion layer of the chip, the via contacts of a second of said supply lines being in electrical contact with said polysilicon layer of the chip;
said diffusion layer and polysilicon layer thereby constituting opposite electrodes of a capacitor having said oxide layer as a dielectric, and the finger portions of said supply lines constituting a plurality of low resistance parallel interconnections between said electrodes and said supply lines;
whereby said capacitor and said low resistance connections provide a low RC time constant path for decoupling the chip from transient impulses on either of the supply lines.

* * * * *